(12) United States Patent
Terosky et al.

(10) Patent No.: US 6,677,823 B2
(45) Date of Patent: Jan. 13, 2004

(54) GAIN COMPENSATION CIRCUIT USING A VARIABLE OFFSET VOLTAGE

(75) Inventors: Jason Terosky, York, PA (US); Anthony Chandler, Cockeysville, MD (US); Paul E. White, York, PA (US); Thomas A. Bachman, II, Darlington, MD (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/083,801

(22) Filed: Feb. 27, 2002

(65) Prior Publication Data

US 2002/0158688 A1 Oct. 31, 2002

Related U.S. Application Data

(60) Provisional application No. 60/271,952, filed on Feb. 28, 2001.

(51) Int. Cl.[7] .................................................. H03G 3/20
(52) U.S. Cl. ........................ 330/289; 330/136; 330/284
(58) Field of Search .......................... 330/2, 136, 144, 330/284, 289

(56) References Cited

U.S. PATENT DOCUMENTS

| | | | |
|---|---|---|---|
| 3,968,453 A | 7/1976 | Hongu et al. ................. 330/29 |
| 4,553,104 A | 11/1985 | Olsen ......................... 330/129 |
| 4,639,938 A | 1/1987 | Kennett ....................... 375/60 |
| 4,691,377 A | 9/1987 | Yoshihara et al. ........... 455/256 |
| 5,138,274 A * | 8/1992 | Nakanishi et al. .......... 330/136 |
| 5,172,071 A | 12/1992 | Braathen .................... 330/129 |
| 5,177,453 A * | 1/1993 | Russell et al. .............. 330/284 |
| 5,208,550 A | 5/1993 | Iwane ........................ 330/129 |
| 5,243,301 A | 9/1993 | Tondryk ..................... 330/296 |
| 5,297,184 A | 3/1994 | Behrens et al. ............... 375/98 |
| 5,319,804 A | 6/1994 | Matsumoto et al. ........ 455/126 |
| 5,369,789 A | 11/1994 | Kosugi et al. .............. 455/126 |
| 5,375,145 A | 12/1994 | Abbott et al. ................. 375/98 |
| 5,408,697 A | 4/1995 | Price et al. ................. 455/239 |
| 5,432,473 A | 7/1995 | Mattila et al. .............. 330/133 |
| 5,485,120 A | 1/1996 | Anvari ....................... 330/151 |
| 5,566,363 A | 10/1996 | Senda ......................... 45/126 |
| 5,604,924 A | 2/1997 | Yokoya ....................... 455/68 |
| 5,613,226 A | 3/1997 | Kanami ...................... 455/115 |
| 5,737,033 A | 4/1998 | Masuda ...................... 348/678 |
| 5,768,694 A | 6/1998 | Kumagai .................... 455/126 |
| 5,912,586 A | 6/1999 | Mitzlaff ...................... 330/149 |
| 5,977,831 A | 11/1999 | Davis et al. ................. 330/279 |
| 6,091,942 A | 7/2000 | Buer et al. ................ 455/234.1 |
| 6,118,342 A | 9/2000 | Yang ......................... 330/289 |
| 6,154,503 A | 11/2000 | Strolle ....................... 375/264 |
| 6,480,061 B2 * | 11/2002 | Dolman et al. ............... 330/2 |

FOREIGN PATENT DOCUMENTS

| | | | |
|---|---|---|---|
| EP | 0 589 574 B1 | 3/1994 | ............ H03G/3/20 |
| EP | 0 928 063 A2 | 7/1999 | ............ H03G/3/30 |
| EP | 1 059 727 A2 | 12/2000 | ............ H03F/1/32 |
| WO | WO 01/11769 A1 | 2/2001 | ............ H03G/3/30 |

* cited by examiner

Primary Examiner—Steven J. Mottola
(74) Attorney, Agent, or Firm—Wood, Herron & Evans, L.L.P.

(57) ABSTRACT

An automatic gain compensation circuit for actively adjusting the gain of an amplifier caused by in-loop and/or out-of-loop influences on system gain. Two matched RF detectors convert pre- and post-amplified signals to input and output voltages representative of the power of the RF signals. A gain control circuit which may include a Digital Analog Converter (DAC) utilizes an offset voltage that is weighted along with the input and output voltages to produce an error voltage. The error voltage is used to drive a voltage-controlled attenuator within the amplification path. Operational amplifiers may be used in the weighting circuits for weighting the input, output, and offset voltages in order to prevent loading of the RF detector outputs and to obtain rapid settling time. During amplifier operation, the offset voltage is adjusted by a processing unit to compensate for gain changes in the amplifier due to out-of-loop temperature-related influences on system gain.

38 Claims, 4 Drawing Sheets

GAIN COMPENSATION CIRCUIT USING A VARIABLE OFFSET VOLTAGE

CROSS-REFERENCE TO RELATED APPLICATIONS

This application claims the filing benefit and priority of U.S. Provisional Patent Application Serial. No. 60/271,952, filed Feb. 28, 2001 by Jason Terosky et al., which application is incorporated by reference herein in its entirety.

FIELD OF THE INVENTION

This invention relates generally to gain compensated amplifiers, and more particularly to a gain compensated system that actively compensates the gain of an amplifier due to closed-loop and out-of-loop influences on system gain.

BACKGROUND OF THE INVENTION

Ideally, power amplifiers provide a constant gain over a wide range of temperatures and frequencies without the need for feedback control. In practice, however, a power amplifier's gain varies due to changes in temperature, frequency response, and linearity effects. Because amplifiers are non-ideal, gain compression (non-linear behavior) becomes more pronounced the closer an amplifier is driven to saturation. Changes in operating temperature and input frequency also cause an amplifier's gain to vary. For example, as operating temperature increases, amplifier gain tends to decrease. To overcome these effects, the gain of an amplifier must be actively compensated.

Other anomalies may cause an amplifier's gain to stray from a desired level. During manufacture of power amplifiers, tolerances among components from unit to unit may cause different amplifiers to have different settling gains under identical operating conditions. Manual calibration of an amplifier is usually required to adjust the amplifier's gain to specification. In addition, the insertion loss of certain components such as connectors, circulators/isolators, and microstrip lines changes with temperature, which causes slight variations of the total unit gain with temperature. These and other anomalies usually require operator adjustment or intervention during operation of the amplifier, a time consuming and undesired necessity.

Gain variation due to temperature changes can be actively compensated using a closed-loop feedback circuit where the output power is compared to a reference, and any deviation in the output power from the reference causes a control circuit to adjust the power amplifier's gain. This automatic gain compensation technique works as long as the amplifier's behavior across a temperature gradient can be determined or predicted. However, such circuits are difficult to mass produce reliably because they often require manual trimming in the manufacturing process to account for closed-loop deviations among components, and so forth, and to account for the out-of-loop temperature effects mentioned above. This trimming or calibration is time-consuming and must be performed unit by unit.

One approach to address some of these effects is to utilize two detectors in an amplifier system to detect an input and output RF signal level and provide these levels to a differential gain control circuit that which is coupled to one or more variable gain amplifier (VGA) stages. The VGA's compensate for the gain of an entire chain of amplifiers. When the individual amplifier gains vary for any reason (i.e., process, temperature effects, or end of life degradation), the variation in gain causes higher or lower levels of detected output reference signals for a given RF input signal. The gain control circuit drives the VGA up or down as appropriate.

The above approach suffers from several disadvantages, however. For example, the approach may require precise laser trimming during the manufacturing process to calibrate the amplifier to a desired operating gain. In addition, once the amplifier is manufactured, there are no out-of-loop mechanisms for adjusting the gain of the amplifier. Moreover, the above approach provides no mechanism for compensating for out-of-loop influences on system gain.

BRIEF DESCRIPTION OF THE DRAWINGS

The invention and further objects and advantages thereof may best be understood by reference to the following description taken in conjunction with the accompanying drawings, in which.

DETAILED DESCRIPTION

Figure 1:
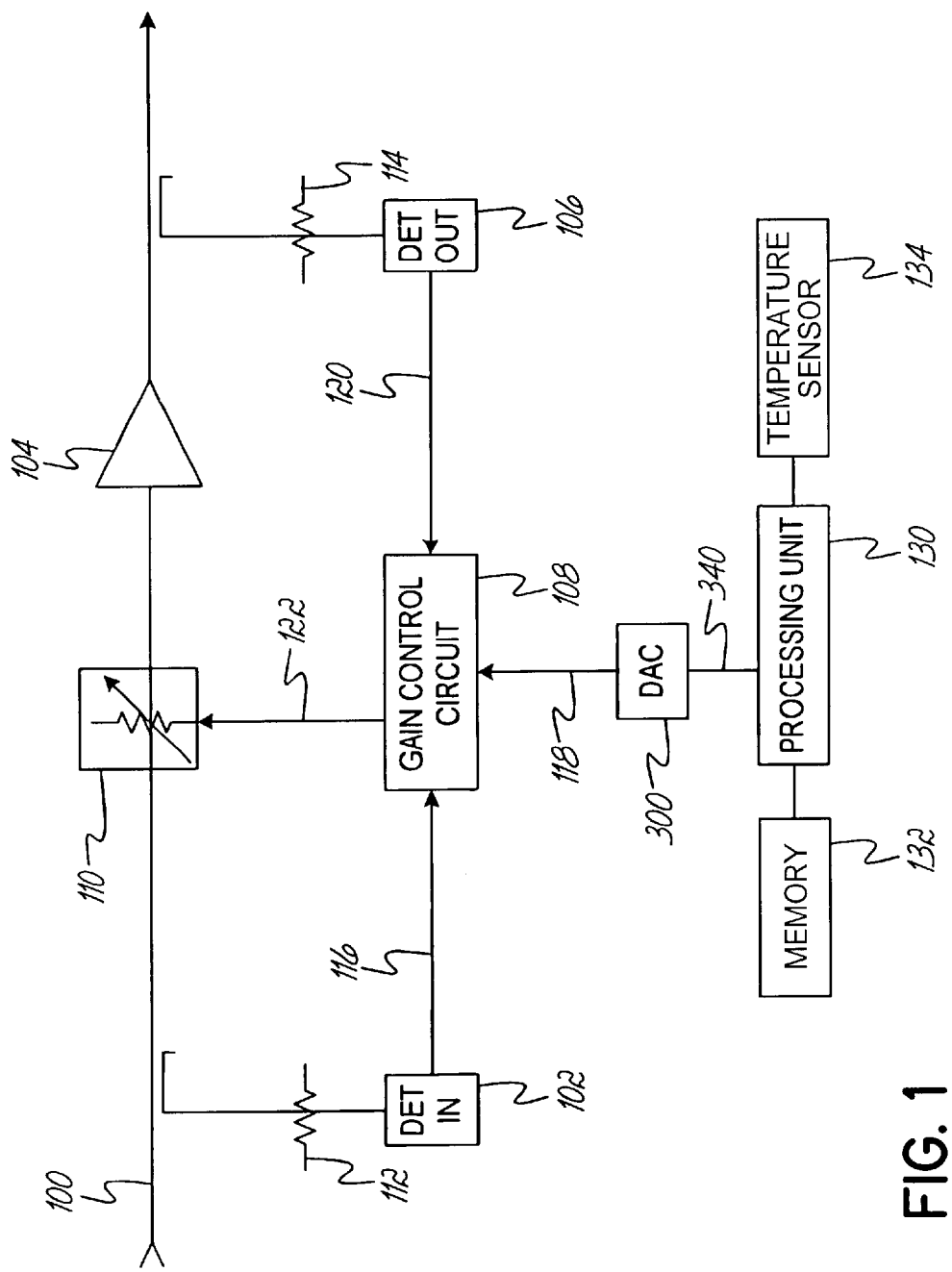
FIG. 1 is a functional block diagram of a gain compensation circuit in an amplifier system according to one aspect of the present invention.

Although the invention will be described next in connection with exemplary embodiments, it will be understood that the invention is not limited to those particular embodiments. On the contrary, the description of the invention is intended to cover all alternatives, modifications, and equivalent arrangements as may be included within the spirit and scope of the invention as defined by the appended claims.

In an exemplary embodiment of the present invention described hereinafter in greater detail, a gain control system is provided that includes a closed loop gain control circuit. The closed loop gain control circuit includes in-loop components such as a voltage-controlled attenuator and a main amplifier. These in-loop components cause in-loop gain changes on the system due to temperature, frequency, and linearity effects, for example. The system also includes out-of-loop components including an input RF detector and an output RF detector, which desirably may be matched, and any number of other components such as microstrip lines, connectors, isolators, or circulators, attenuators, and so forth. It has been found that these out-of-loop components may cause out-of-loop gain changes on the system due to temperature.

In one embodiment consistent with the invention, a closed loop gain control circuit is connected to an input RF detector and an output RF detector, and provides an error signal to a voltage-controlled attenuator (VCA) for adjusting the gain of a main amplifier. A compensation circuit, e.g., processing unit connected to a digital-to-analog converter, provides a multifunction control signal to the gain control circuit for the purpose of varying the error signal to compensate the system for one or more influences on the gain of the system that are not accommodated for by the closed loop gain control circuit. The multifunction control signal is provided outside the control loop and is weighted with respect to the output signals from the input RF detector and output RF detector, so that the combination of these three signals forms the error signal that controls the VCA.

The multifunction control signal has at least two functions associated with compensating for influences that are not accommodated for by the closed loop gain control. First, it may be used to calibrate the amplifier to minimize the deviation between an initial gain and a desired operational gain to within a predetermined tolerance value. In this regard, the initial gain is typically an as-manufactured gain for the system, prior to any compensation. This initial gain may vary from unit to unit due to manufacturing variations. The operational gain is the desired gain for the finished product during operational use. In fixed gain amplifier systems, the operational gain is therefore a fixed gain specified for a particular system (e.g., a 50 Watt amplifier). In many instances, an amplifier is manufactured with an initial gain that exceeds the operational gain, so that control over the VCA results in some attenuation being applied to the main signal path at all times.

Second, the multifunction control signal may be used during operation to compensate for other residual influences not accommodated for by the closed gain control loop. These influences may be due to, for example, out-of-loop temperature influences caused by out-of-loop components. Note that system fluctuations in gain may be the result of closed-loop influences or out-of-loop temperature influences, or both. The multifunction control signal may be used to compensate for each of these system fluctuations to obtain optimal gain variation compensation.

Referring to FIG. 1, there is shown a functional block diagram of a gain control circuit in an amplifier system according to one aspect of the present invention. In an exemplary embodiment, the amplifier system provides at least 50 watts of electrical power to a base station antenna, though other power levels are expressly contemplated. In addition, the amplifier system may include a power amplifier or any signal amplifier. Finally, the amplifier system in the herein-described embodiment may be implemented to operate in a wide variety of frequency bands, including AMPS, DCS, PCS, UMTS, and MMDS, though other frequency bands are expressly contemplated.

The system generally includes a main signal path 100, an input RF detector 102, a main amplifier 104, an output RF detector 106, a gain control circuit 108, and a voltage-controlled attenuator (VCA) 110. A closed loop gain control circuit includes both in-loop components such as the main amplifier 104 and the VCA 110 and out-of-loop components such as the input RF detector 102 and the output RF detector 106. The in-loop components may cause the system gain to fluctuate due to changes in temperature, frequency, or linearity effects. The closed loop gain control circuit typically compensates for these in-loop influences. However, the closed loop gain control circuit typically cannot compensate for residual influences caused by out-of-loop components. Consistent with the invention, an out-of-loop control signal, the offset voltage on line 118 in the exemplary embodiment, is adjusted to compensate for these residual out-of-loop temperature influences.

Still referring to FIG. 1, RF signals are received in the main signal path 100, and are coupled to the input RF detector 102, which converts the coupled RF signals to an input voltage representative of the power of the coupled RF signals. Note that sometimes the input to an RF detector is expressed in terms of dBV, or voltage, but it may also be expressed in terms of dBm, or power.

The RF signals input to an input portion of signal path 100 are amplified by the main amplifier 104, which produces amplified RF signals on an output portion of signal path 100 following amplifier 104. Optionally, the main amplifier 104 may include more than one amplifying stage. In another aspect of the present invention, another amplifier (not shown), which also may include more than one stage, may be provided before the VCA 110 to amplify the RF signals before they are fed to the main amplifier 104 or may be provided after the main amplifier 104 to further amplify the amplified RF signals.

The input attenuator 112 attenuates the coupled RF signals from the input portion of the main signal path 100, and the output attenuator 114 attenuates the coupled amplified RF signals on output portion of the main signal path 100 after amplification by the main amplifier 104. The attenuation factors are chosen such that the power received by input RF detector 102 is substantially equal to the power received by output RF detector 106 when the amplifier is operating at a desired operational gain. For example, if the system is designed for a desired operational gain of 37 dB across the PCS frequency spectrum, then the input RF detector 102 and the output RF detector 106 should provide substantially the same voltage when the amplifier is operating at or substantially near its desired operational gain. The initial gain of the amplifier is the gain that the amplifier achieves without any active compensation for out-of-loop temperature influences. It may or may not be within a predetermined tolerance range of a desired operational gain. Calibrating the amplifier from its initial gain to a desired operational gain (within a predetermined tolerance range if desired) is explained in more detail below.

The amplified RF signals are coupled to the output RF detector 106, which converts the coupled amplified RF signals to an output voltage representative of the power of the coupled amplified RF signals. Typically, the input RF detector 102 and output RF detector 106 are matched so that the detectors 102, 106 produce substantially the same output characteristic under identical input conditions. The use of two matched RF detectors permits the detectors to track each other, and as the actual operating gain of the power amplifier varies due to changes in temperature, frequency, or linearity effects, the differences in the output voltages of the RF detectors 102, 106 may be used to adjust the VCA 110 until the power amplifier returns to a desired operational gain. If the input RF detector 102 and output RF detector 106 are not matched, additional out-of-loop compensation may be performed as explained below. In one embodiment, the RF detectors 102, 106 are Analog Devices AD8314ARM devices. It is expressly understood, however, that any other suitable power detector may be used instead, such as, for example, a Schottky diode.

The gain control circuit 108 includes at least three input controls: a voltage on line 116 from the input RF detector 102 is representative of the input power of the RF signals in the input portion of the main signal path 100; a voltage on line 120 from the output RF detector 106 is representative of the output power of the amplified RF signals in the output portion of the main signal path 100 after they have been amplified by the main amplifier 104; and an offset voltage on line 118 is provided to calibrate the power amplifier to a desired operational gain and to compensate for out-of-loop temperature influences which may cause the amplifier to stray from the desired operational gain during operation. Examples of out-of-loop components that may cause out-of-loop temperature influences on system gain are provided in connection with FIG. 4 below.

A compensation circuit including a processing unit 130 and a digital-to-analog converter (DAC) is also shown in FIG. 1. These devices will be described in more detail in connection with FIG. 3 below.

Figure 2:
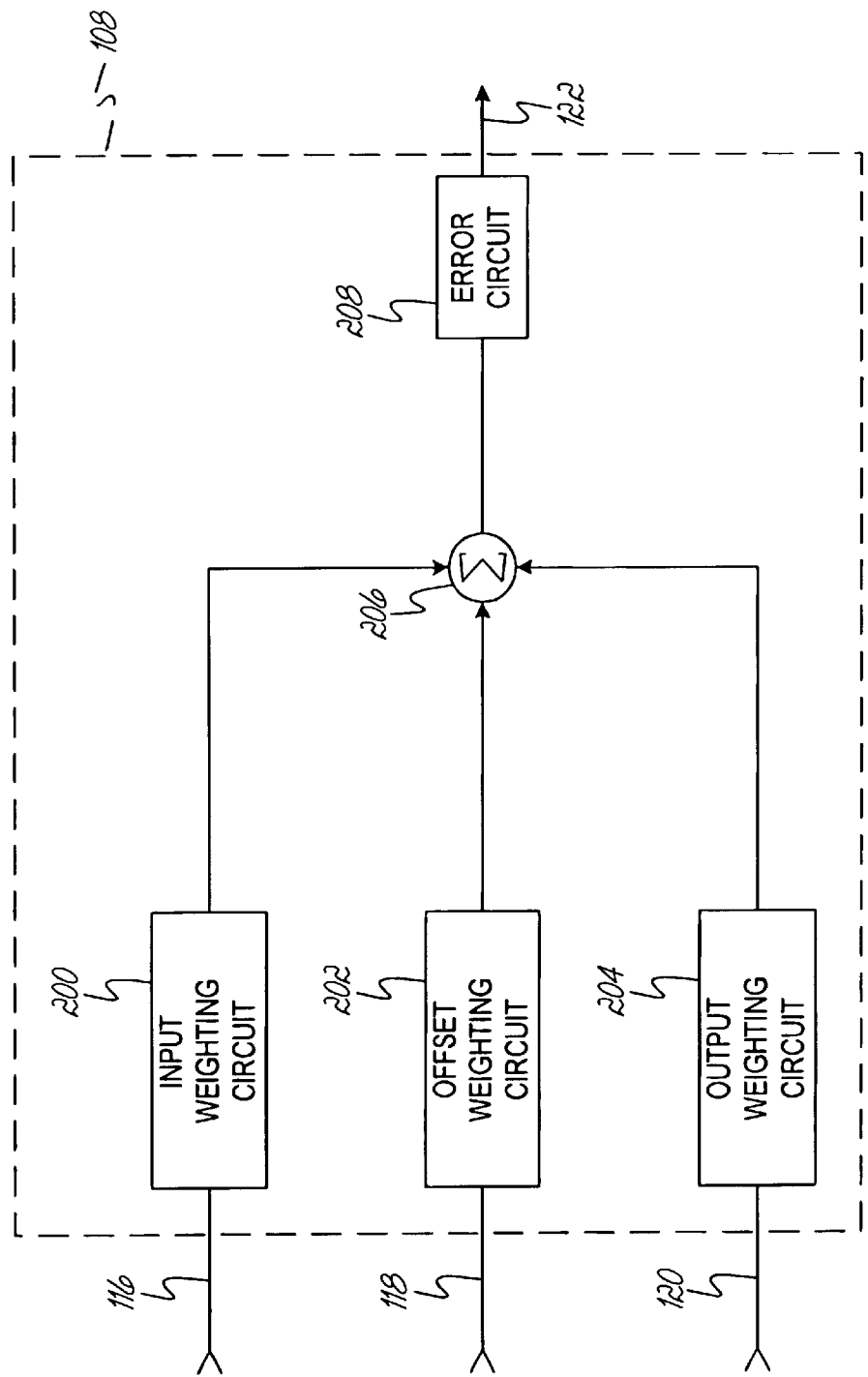
FIG. 2 is a functional block diagram of the gain control circuit according to one aspect of the present invention.

FIG. 2 shows a functional block diagram of the gain control circuit 108 according to one aspect of the present invention. The gain control circuit 108 includes an input weighting circuit 200, an offset weighting circuit 202, an output weighting circuit 204, a summing point 206, and an error circuit 208. Each of the offset weighting circuit 202, input weighting circuit 200, and output weighting circuit 204 is assigned a predetermined weight. Exemplary weights for these circuits are described below. The voltages from the input weighting circuit 200, the offset weighting circuit 202, and the output weighting circuit 204 are combined at summing point 206 according to their respective weights. An error voltage on line 122 represents the weighted sums of the voltages at summing point 206. The error voltage on line 122 is provided as an error signal to the VCA 110, which attenuates the RF signals in the main signal path 100 based on the error voltage. Note that the error voltage on line 122 may cause the RF signals in the main signal path 100 to be attenuated more or less depending upon the current set point of the VCA 110.

Figure 3:
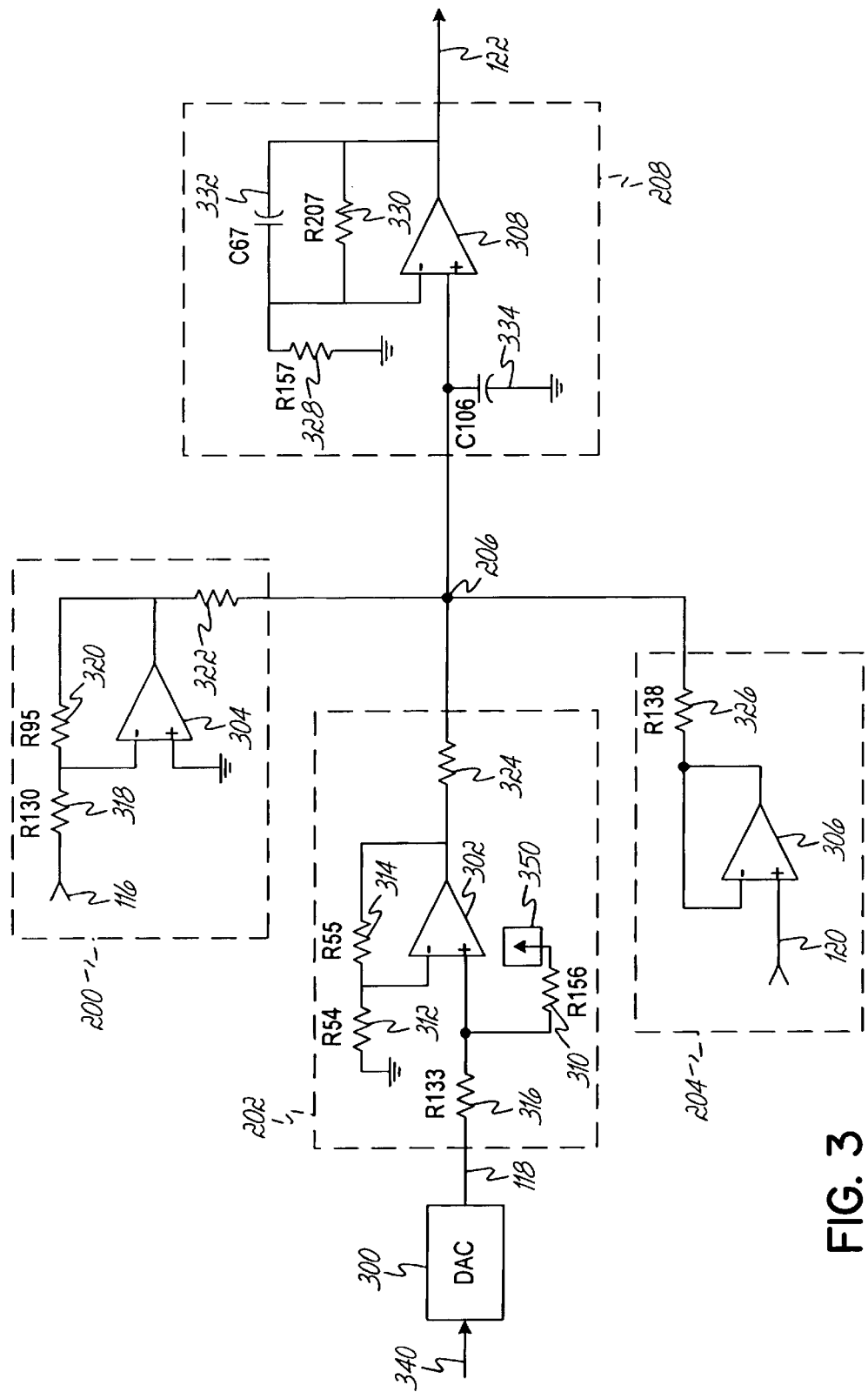
FIG. 3 is a circuit block diagram of the gain control circuit 108 according to a specific aspect of the present invention.

FIG. 3 shows a circuit block diagram of the gain control circuit 108 according to a specific aspect of the present invention. The gain control circuit 108 includes the offset weighting circuit 202, the input weighting circuit 200, the output weighting circuit 204, and the error circuit 208. The DAC 300 of the compensation circuit is connected to the offset weighting circuit 202.

The offset weighting circuit 202 includes an offset operational amplifier (op amp) 302. Op amps are desirable because of their high input impedance and fast analog switching ability. They also prevent undesirable loading of the outputs of the RF detectors 102, 106. In one aspect of the present invention, the offset voltage on line 118 is provided to the non-inverting input of the offset op amp 302. Resistors 316 and 310 create a voltage divider between the offset voltage on line 118 and the negative voltage supply 350. In the exemplary embodiment, the negative voltage supply 350 is negative five volts (−5 V). The voltage divider created by resistors 316 and 310 is necessary to swing the output voltage of the DAC 300 negative. Feedback resistors 312 and 314 set the gain of the offset op amp 302. In the exemplary embodiment, resistors 312 and 314 are equal, resulting in a gain of 2 for the offset op amp 302.

The input weighting circuit 200 includes an input op amp 304. The input voltage on line 116 is fed to the inverting input of the input op amp 304, and the gain of the input op amp 304 is determined by resistors 318 and 320. In the exemplary embodiment, resistors 318 and 320 are equal, resulting in a unity gain in the input op amp 304.

The output weighting circuit 204 includes an output op amp 306. In the exemplary embodiment, the output op amp 306 is a voltage follower having unity gain. Those skilled in the art will readily understand how to select the values for the resistors to achieve a desired gain in an op amp.

The DAC 300 receives a digital signal on line 340 representative of a desired offset voltage from the processing unit 130 and converts the digital signal on line 340 to an offset voltage representative of the digital signal on line 340. The digital signal on line 340 from the processing unit 130 to the DAC 300 may be in serial or parallel form. The DAC 300 may be separate from the processing unit 130 or it may be incorporated into the processing unit 130. The desired offset voltage may be selected from a lookup table as described in more detail below.

The weights of the input weighting circuit 200, offset weighting circuit 202, and output weighting circuit 204 are assigned according to the selection of resistors 322, 324, and 326. In the exemplary embodiment, resistors 322 and 326 are identical, resulting in the input voltage on line 116 and the output voltage on line 120 receiving equal weight. Also, in the exemplary embodiment, resistor 324 is different from resistors 322 and 326, resulting in a different weight being assigned to the offset voltage on line 118. The selection of resistor 324 is discussed below.

The voltage at the summing point 206 represents the summation of the voltages according to their respective weights. The voltage at summing point 206 is provided to the error circuit 208, which will be described next.

The error circuit 208 includes an error op amp 308, whose gain is determined by the selection of resistors 328 and 330. The voltage at summing point 206 is provided to the non-inverting input of the error op amp 308. The output of the error op amp 308 drives the VCA 110 via offset voltage 122. Capacitor 332 is an integrating capacitor which slows the output swings in the error op amp 308 preventing undesired oscillation of the VCA 110.

In one aspect of the present invention, the driving equation for the VCA 110 is dictated by the formula $V_{out}-V_{in}+[\beta*V_{offset}]$, where $V_{out}$ is the output voltage on line 120, $V_{in}$ is the input voltage on line 116, and $V_{offset}$ is the offset voltage on line 118. Because the output voltage on line 120 and input voltage on line 116 are weighted equally, the weight $\beta$ of the offset voltage on line 118 may be determined by modeling the circuitry through a simulator such as SPICE. Weighting the input and output voltages equally simplifies the math, but they do not have to be weighed equally. If they are weighted equally, resistors 326 and 322 must be equal, assuming the input op amp 304 and output op amp 306 each have unity gain and similar performance characteristics. Again, unity gain simplifies the math, but other op amp gain and weighting-resistor combinations may be used, so long as the driving equation is met at the input of the error op amp 308. It is expressly understood that there are limitless combinations of op amp gain and weighting resistors that satisfy the driving equation set forth above. The implementation of unity gain in the input op amp 304 and output op amp 306 and identical resistors 326 and 322 permits easy modeling of the circuitry to determine $\beta$.

The following table summarizes the values for the resistors according to a specific embodiment of the present invention. It is expressly contemplated, however, that other values could be selected without departing from the spirit and scope of the present invention. Those values depend in part on the selected gains for each buffer op amp and the desired weights to be assigned to each voltage.

TABLE 1

| Component | Value |
|---|---|
| 310 | 43.2 KΩ |
| 312 | 10.2 KΩ |
| 314 | 10.2 KΩ |
| 316 | 10.2 KΩ |
| 318 | 10.2 KΩ |
| 320 | 10.2 KΩ |
| 322 | 10.2 KΩ |
| 324 | 47.5 KΩ |
| 326 | 10.2 KΩ |
| 328 | 1.0 KΩ |
| 330 | 82.5 KΩ |
| 332 | 4700 pF |
| 334 | 4700 pF |

The offset voltage on line 118 functions as a compensation signal and typically plays at least two roles. In a first role, the offset voltage may be used to calibrate the initial gain of the amplifier to a desired operational gain. When the amplifier is first powered up, the initial gain may vary slightly from a desired operational gain, even though the amplifier system was designed to achieve a desired operational gain. For example, suppose the amplifier was designed to achieve a desired operational gain of 37 dB, but the amplifier produces an initial gain of 40 dB. This gain variation is undesired if it falls outside a predetermined tolerance value. For example, a design specification may require that the gain variation not exceed a predetermined tolerance value of 0.5 dB. An initial operating gain of 40 dB is thus unacceptable. The effects of gain variation may be multiplied as the number of amplifier stages increases. To compensate for this gain variation, calibration or trimming of the amplifier's gain is necessary.

During calibration of the amplifier, the offset voltage on line 118 is adjusted upwards or downwards via the DAC 300 until the desired operational gain (for example, 37 dB) is achieved to within a certain predetermined tolerance value (for example, plus or minus 0.5 dB). Once the desired operational gain is reached, a digital value representative of the offset voltage when the desired operational gain (within a predetermined tolerance value) is achieved may be stored in a memory device such as an EEPROM or any other suitable memory device (e.g., memory device 132 of FIG. 1). Alternatively, the digital value may be stored in a memory device in the processing unit 130 (e.g., within non-volatile memory integrated into an integrated circuit in the processing unit). Following power up, the processing unit retrieves the digital value, provides it to the DAC 300, which converts the digital value to a corresponding offset voltage on line 118. By way of example only, the digital value may represent an 8-bit binary value from 0 to 127, where 0 represents −5 volts and 127 represents +5 volts, and values in between represent voltages within the range of −5 volts to +5 volts. Once the digital value has been selected, the amplifier may be calibrated after being produced with relatively little effort, and often without having to mechanically trim any components in the amplifier as with many conventional designs. Storage of the digital value in a memory device permits comparatively easier post-production calibration, given that an electrical modification (e.g., via storage of one or more digital values, or modification of an electrical characteristic of a circuit, as described in greater detail below) is typically all that is required.

In a second role, the offset voltage on line 118 compensates for residual out-of-loop temperature influences on system gain that cannot be compensated for by the closed-loop gain control. These out-of-loop temperature influences are residual in the sense that they are not adequately accommodated for by the closed loop gain control circuit. Thus, during operation, the offset voltage on line 118 can be used to actively compensate for residual changes in system gain due to out-of-loop temperature influences, as will be explained below.

Figure 4:
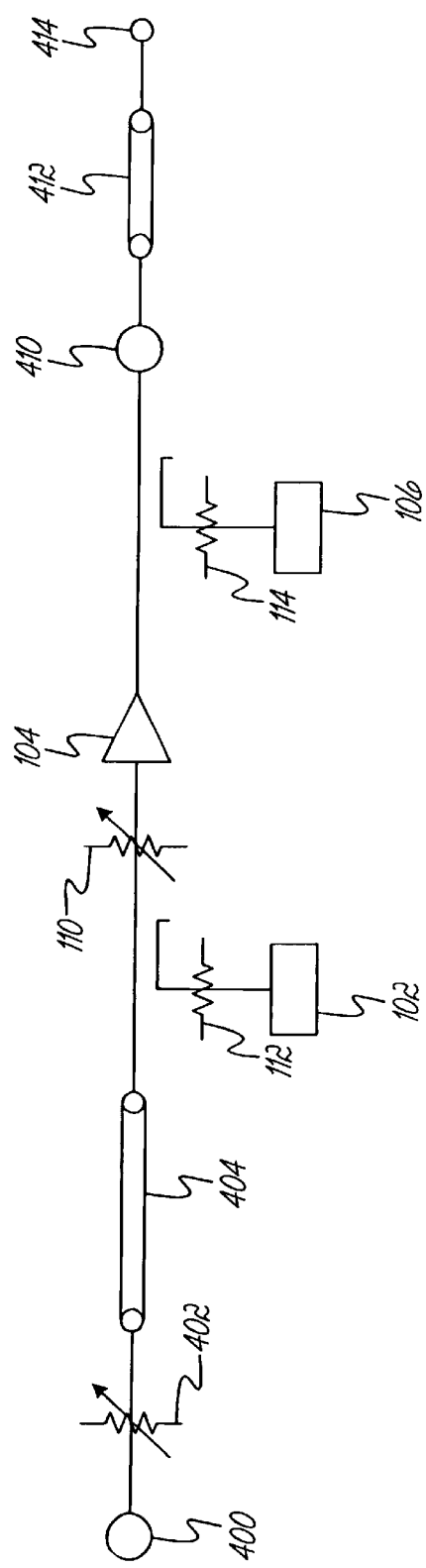
FIG. 4 is a functional block diagram of a gain compensation circuit including out-of-loop components according to a specific aspect of the present invention.

FIG. 4 is a functional block diagram of a gain compensation circuit including out-of-loop components according to a specific aspect of the present invention. The out-of-loop components may include an input connector 400, an input attenuator 402, an input microstrip line 404, an output isolator 410, an output microstrip line 412, and an output connector 414. Note that although the main amplifier 104 and VCA 110 are shown in FIG. 4, these components are in-loop components. It is expressly understood that the out-of-loop components shown in FIG. 4 are provided by way of example only, and that other, additional, or fewer out-of-loop components may be provided depending on design specifications. The behavior of the out-of-loop components across temperature should be predictable or determinable. Another out-of-loop temperature influence may be caused by mismatched input RF detector 102 and output RF detector 106, however, as explained earlier, these detectors are typically identical to avoid additional complexity and calibration. Input attenuator 112 and output attenuator 114 may also cause an undesired out-of-loop temperature influence on system gain.

To compensate the amplifier's gain for these out-of-loop temperature influences, the temperature versus gain behavior of the amplifier with the out-of-loop components must be determined. In the exemplary embodiment, the amplifier's gain is tested at three different temperatures to determine a relationship between temperature and gain. Alternatively, more or fewer temperature calibrations may be performed, depending on how strict the tolerance requirements are for a particular amplifier. For example, an amplifier with a gain tolerance of plus or minus 2 dB may not require compensation for out-of-loop temperature effects at all. They may be so slight as to not vary the amplifier's gain outside of the tolerance level across an operating range of temperatures. An amplifier with a tolerance of plus or minus 1 dB may require only two or three temperature calibrations, but interpolation may suffice to adjust the amplifier's gain across other temperatures. The interpolation may not precisely track the amplifier's gain behavior across temperature, but it may be sufficient to keep the gain from straying outside the tolerance range. However, an amplifier with a very high tolerance, such as, for example, plus or minus 0.25 dB, however, may require numerous temperature readings to model accurately gain behavior across a desired range of temperatures and it may require a more sophisticated interpolation, such as piecewise linear for instance. In summary, the stricter the tolerance, the more temperature readings that may be required to ascertain a relationship between gain and temperature such that the operating gain of the amplifier does not stray outside a predetermined tolerance range.

To determine gain behavior across temperature, a reading may be taken at room temperature. The offset voltage on line 118 may be adjusted until the gain returns to the desired operating gain, for example, 37 dB, within a predetermined tolerance value, for example, plus or minus 0.5 dB. A value representative of this offset voltage on line 118 may be stored in a memory device, such as an EEPROM or any other suitable memory device (e.g., memory device 132), along with the corresponding room temperature value. Next, another reading may be taken at a hot temperature, such as 40 degrees Celsius. The offset voltage on line 118 again is adjusted until the gain returns to the desired operating gain within a predetermined tolerance value. A digital representation of this voltage may be stored in a memory device. Note that these readings do not have to occur in this order. A final reading may be taken at a cold temperature, such as 0 degrees Celsius. A value representative of the offset voltage on line 118 that returns the gain to a desired operating gain (within a predetermined tolerance value) may be stored in a memory device, along with the corresponding temperature.

Once all the temperature readings have been made and optionally stored, a relationship may be determined between gain and temperature. In an exemplary embodiment, it is found after three readings that the behavior is substantially linear across a certain desired range of temperatures. Accordingly, linear interpolation may be used to select the appropriate offset voltage on line 118 at any particular temperature in a desired range. It should be readily understood that a linear relationship may be derived from only two readings, and may be approximated through more than two readings. For strict tolerance requirements, a piecewise linear interpolation or a more sophisticated interpolation may be required to prevent the gain from falling outside the tolerance across a desired range of operating temperatures.

In some embodiments, the variation due to out-of-loop temperature effects are substantially repeatable between manufactured units such that the variations determined during calibrating of one or more sample units for temperature can be used for subsequent units, thus eliminating the need for performing temperature calibration for each individual unit. For example, it may be desirable in some embodiments to perform a sample run of units (e.g., ten units) and perform temperature calibration on those sample units to determine a slope coefficient defining a linear relationship between gain and temperature. The slope coefficient would then be initially programmed into all subsequent manufactured units such that, during post-production calibration, each unit would only require calibration to determine the appropriate offset value for the linear equation. Such calibration could be accomplished, for example, simply by determining the required offset voltage at room temperature, and storing this offset in the unit. With both the offset and slope coefficients known, simple application of the linear equation appropriately characterizes the required offset voltage to be generated by the compensation circuit across the operating temperature range of the unit.

In other embodiments, during operation of the amplifier, values representative of offset voltages at various temperatures may be retrieved from a lookup table, such as an EEPROM, or the appropriate offset voltage on line 118 may be calculated according to a function stored in a memory device such as a ROM or hard drive, or any other suitable memory device. Temperature sensing may be performed by, for example, by any number of temperature sensors, e.g., an external temperature sensor 134 (FIG. 1) such as a thermocouple, a thermistor, a diode, a transistor, etc., or even an internal temperature sensor such as a diode or other semiconductor device integrated into an integrated circuit (e.g., that of the processing unit). However, any other suitable temperature sensor or other device responsive to changes in temperature and capable of outputting a temperature-dependent signal may be employed instead.

It will be appreciated that compensation for initial deviation of an amplifier, and compensation for temperature and other out-of-loop influences, may be implemented separately in some embodiments. For example, a fixed compensation signal may be generated in certain instances to accommodate for undesired deviation and thus calibrate a system for a desired operational gain. Otherwise, if other influences are addressed, a variable compensation signal may be generated. Moreover, separate compensation signals may be generated to handle different types of influences.

Various alternative compensation circuit implementations may be used consistent with the invention. For example, various analog circuits that provide a fixed offset voltage may be used where a fixed compensation signal is desired, e.g., a voltage divider circuit, an op amp circuit, a voltage reference circuit, a voltage regulator circuit, etc. In such circuits, calibration of a system may be implemented, for example, by tuning a potentiometer or variable resistor or capacitor, or replacing or installing a particular resistor, capacitor, inductor, etc. Moreover, other electrical parameters, e.g., capacitance, inductance, etc. may be varied in one or more electronic components in a compensation circuit so as to generate an appropriate compensation signal consistent with the invention. Furthermore, digital and/or digital/analog circuits may be used to generate a fixed compensation signal, e.g., a combination of DIP switches with a DAC, whereby configuration of the DIP switches sets an electrical parameter for the circuit.

Moreover, various alternative compensation circuit implementations may be used for providing variable compensation signals, including many of the aforementioned analog, digital and digital/analog circuits modified so as to include a temperature sensor or other sensor appropriate for a particular out-of-loop influence. For example, a voltage divider circuit may be used with a thermistor used in one branch of the voltage divider.

Moreover, where a processing unit is used, various manners of calculating appropriate digital values for a compensation signal may be used. Where no temperature sensing is used, a digital value may be programmed into the processing unit (or an external memory) during calibration, resulting in the generation of a fixed compensation signal. Otherwise, a temperature-dependent signal from a temperature signal may be used to generate an appropriate compensation signal, e.g., via a lookup table and/or analysis of an equation characterized by coefficients programmed during calibration.

Other modifications will be apparent to one of ordinary skill in the art.

The above-described embodiments provide a number of advantages over conventional designs. For example, embodiments consistent with the invention are capable of adjusting the gain of a power amplifier to a desired operational gain regardless of closed-loop and out-of-loop influences on system gain, e.g., due to temperature, frequency response, linearity effects, etc. Moreover, embodiments consistent with the invention are typically able to provide automatic gain control without the need for operator adjustments or other intervention during operation. Furthermore, embodiments consistent with the invention are often capable of being set up and calibrated with substantially less effort than conventional designs. As a result, embodiments consistent with the invention are typically well suited for mass-production, and with high repeatability from unit to unit.

Various additional modifications will be apparent to one of ordinary skill in the art having the benefit of the instant disclosure. Therefore, the invention lies in the claims hereinafter appended.

What is claimed is:

1. A gain control circuit arrangement for a power amplifier, the circuit arrangement comprising:
   (a) a closed loop gain control circuit configured to generate an error signal for controlling the gain of the power amplifier; and
   (b) a compensation circuit coupled to the closed loop gain control circuit and configured to generate a compensation signal outside of the closed loop gain control circuit that is used to vary the error signal so as to compensate for at least one influence on the gain of the power amplifier that is not accommodated for by the closed loop gain control circuit;
wherein the influence comprises a deviation between an initial pain for the Dower amplifier and a desired gain for the power amplifier, and wherein the compensation circuit is configured to output a variable compensation signal having a fixed component based upon the deviation between the initial and desired gains, and a variable component based upon an out-of-loop influence on the gain of the power amplifier.

2. The circuit arrangement of claim 1, wherein the out-of-loop influence comprises temperature.

3. The circuit arrangement of claim 2, wherein the out-of-loop influence comprises a temperature effect on at least one of an input connector, an input attenuator, an input microstrip line, an output isolator, an output microstrip line, and an output connector in the power amplifier.

4. The circuit arrangement of claim 2, wherein the out-of-loop influence comprises a temperature effect due to a mismatch between an input RF detector and an output RF detector in the closed loop gain control circuit.

5. The circuit arrangement of claim 2, wherein the compensation circuit comprises a temperature sensor configured to output a temperature-dependent signal.

6. The circuit arrangement of claim 5, wherein the temperature sensor is selected from the group consisting of a thermistor, a thermocouple, a diode, and a transistor.

7. The circuit arrangement of claim 5, wherein the compensation circuit further comprises a memory device configured to store a lookup table that stores, for each of a plurality of values of the temperature-dependent signal, a corresponding value for the compensation signal.

8. The circuit arrangement of claim 5, wherein the compensation circuit further comprises a processing unit configured to generate the compensation signal from the temperature-dependent signal using a compensation equation.

9. The circuit arrangement of claim 8, wherein the compensation circuit further comprises a memory device configured to store at least one coefficient for the compensation equation.

10. A gain control circuit arrangement for a power amplifier, the circuit arrangement comprising:
(a) a closed loop gain control circuit configured to generate an error signal for controlling the gain of the power amplifier; and
(b) a compensation circuit coupled to the closed loop gain control circuit and configured to generate a compensation signal outside of the closed loop gain control circuit that is used to vary the error signal so as to compensate for at least one out-of-loop temperature influence on the gain of the power amplifier that is not accommodated for by the closed loop gain control circuit;
wherein the compensation circuit comprises a temperature sensor configured to output a temperature-dependent signal, and wherein the compensation circuit further comprises a memory device configured to store a lookup table that stores, for each of a plurality of values of the temperature-dependent signal, a corresponding value for the compensation signal.

11. The circuit arrangement of claim 10, wherein the influence comprises a deviation between an initial gain for the power amplifier and a desired gain for the power amplifier.

12. The circuit arrangement of claim 11, wherein the power amplifier is a fixed gain amplifier, and wherein the desired gain is an operational gain for the power amplifier.

13. The circuit arrangement of claim 11, wherein the compensation circuit is configured to output a fixed compensation signal.

14. The circuit arrangement of claim 13, wherein the value of the fixed compensation signal is determined during calibration of the power amplifier.

15. The circuit arrangement of claim 11, wherein the compensation circuit is configured to output a variable compensation signal having a fixed component based upon the deviation between the initial and desired gains, and a variable component based upon an out-of-loop influence on the gain of the power amplifier.

16. The circuit arrangement of claim 1, wherein the compensation circuit comprises a processing unit configured to generate a digital compensation value, and a digital to analog converter coupled to receive the digital compensation value and generate an analog compensation signal having a voltage based upon the digital compensation value.

17. The circuit arrangement of claim 1, wherein the closed loop gain control circuit comprises:
(a) an input detector configured to generate an input detector signal representative of an input power to the power amplifier;
(b) an output detector configured to generate an output detector signal representative of an output power of the power amplifier;
(c) an error circuit configured to generate the error signal from the input detector signal, the output detector signal, and the compensation signal; and
(d) a variable attenuator coupled to a signal path in the power amplifier and configured to variably attenuate a signal present on the signal path in response to the error signal.

18. A method of controlling gain in a power amplifier, comprising:
(a) generating a compensation signal outside of a closed loop gain control circuit in the power amplifier that compensates for at least one influence on the gain of the power amplifier that is not accommodated for by the closed loop gain control circuit; and
(b) using the compensation signal to control the gain of the power amplifier with the closed loop gain control circuit;
wherein the influence comprises a deviation between an initial pain for the power amplifier, and a desired pain for the power amplifier, and wherein generating the compensation signal includes generating a variable compensation signal, wherein the variable compensation signal has a fixed component based upon the deviation between the initial and desired gains, and a variable component based upon an out-of-loop influence on the gain of the power amplifier.

19. The method of claim 18, wherein the out-of-loop influence comprises temperature.

20. The method claim 19, wherein generating the compensation signal includes accessing a lookup table that stores, for each of a plurality of values of a temperature-dependent signal generated by a temperature sensor, a corresponding value for the compensation signal.

21. The method of claim 19, wherein generating the compensation signal includes processing a temperature-dependent signal generated by a temperature sensor using a compensation equation.

22. A method of controlling gain in a power amplifier, comprising:
(a) generating a compensation signal outside of a closed loop gain control circuit in the power amplifier that compensates for at least one influence on the gain of the power amplifier that is not accommodated for by the closed loop gain control circuit; and
(b) using the compensation signal to control the gain of the power amplifier with the closed loop gain control circuit;
wherein generating the compensation signal includes accessing a lookup table that stores, for each of a plurality of values of a temperature-dependent signal generated by a temperature sensor, a corresponding value for the compensation signal.

23. The method of claim 22, wherein the influence comprises a deviation between an initial gain for the power amplifier, and a desired gain for the power amplifier.

24. The method of claim 23, wherein the power amplifier is a fixed gain amplifier, and wherein the desired gain is an operational gain for the power amplifier.

25. The method of claim 23, wherein generating the compensation signal includes generating a fixed compensation signal.

26. The method of claim 25, wherein the value of the fixed compensation signal is determined during calibration of the power amplifier.

27. The method of claim 23, wherein generating the compensation signal includes generating a variable compensation signal, wherein the variable compensation signal has a fixed component based upon the deviation between the initial and desired gains, and a variable component based upon an out-of-loop influence on the gain of the power amplifier.

28. A method of calibrating a fixed gain amplifier to operate at an operational gain, wherein the fixed gain amplifier initially operates at an initial gain that differs from the operational gain, the method comprising:
(a) adjusting a compensation signal generated by a compensation circuit outside of a closed loop gain control circuit in the power amplifier until the gain of the power amplifier is proximate the operational gain; and
(b) modifying at least one electrical parameter for the compensation circuit based upon a value of the adjusted compensation signal to calibrate the power amplifier to operate at the operational gain;
wherein adjusting the compensation signal is performed at a first temperature, the method further comprising adjusting the compensation signal at a second temperature, wherein modifying at least one electrical parameter is based upon the value of the adjusted compensation signal at each of the first and second temperatures.

29. The method of claim 28, wherein modifying at least one electrical parameter includes storing a value in a memory device.

30. The method of claim 28, wherein modifying at least one electrical parameter includes varying at least one of a resistance value, a capacitance value, and an inductance value for an electronic component in the compensation circuit.

31. The method of claim 28, wherein modifying at least one electrical parameter includes storing at least one coefficient used by a compensation equation processed by the compensation circuit to generate the compensation signal from a temperature-dependent signal.

32. The method of claim 28, wherein modifying at least one electrical parameter includes storing a plurality of values in a lookup table to map the compensation signal to a temperature-dependent signal.

33. A gain control circuit arrangement for a power amplifier, the circuit arrangement comprising:
(a) a closed loop gain control circuit configured to generate an error signal for controlling the gain of the power amplifier; and
(b) a compensation circuit coupled to the closed loop gain control circuit and configured to generate a compensation signal outside of the closed loop gain control circuit that is used to vary the error signal so as to compensate for at least one influence on the gain of the power amplifier that is not accommodated for by the closed loop gain control circuit;
wherein the influence comprises an out-of-loop temperature influence that comprises a temperature effect on at least one of an input connector, an input attenuator, an input microstrip line, an output isolator, an output microstrip line, and an output connector in the power amplifier.

34. A gain control circuit arrangement for a power amplifier, the circuit arrangement comprising:
(a) a closed loop gain control circuit configured to generate an error signal for controlling the gain of the power amplifier and
(b) a compensation circuit coupled to the closed loop gain control circuit and configured to generate a compensation signal outside of the closed loop gain control circuit that is used to vary the error signal so as to compensate for at least one influence on the gain of the power amplifier that is not accommodated for by the closed loop gain control circuit;
wherein the influence comprises an out-of-loop temperature influence that comprises a temperature effect due to a mismatch between an input RF detector and an output RF detector in the closed loop gain control circuit.

35. A gain control circuit arrangement for a power amplifier, the circuit arrangement comprising:
(a) a closed loop gain control circuit configured to generate an error signal for controlling the gain of the power amplifier; and
(b) a compensation circuit coupled to the closed loop gain control circuit and configured to generate a compensation signal outside of the closed loop gain control circuit that is used to vary the error signal so as to compensate for at least one out-of-loop temperature influence on the gain of the power amplifier that is not accommodated for by the closed loop gain control circuit;
wherein the compensation circuit comprises a temperature sensor configured to output a temperature-dependent signal, and wherein the compensation circuit further comprises a processing unit configured to generate the compensation signal from the temperature-dependent signal using a compensation equation.

36. The circuit arrangement of claim 35, wherein the influence comprises a deviation between an initial gain for the power amplifier and a desired gain for the power amplifier, and wherein the compensation circuit is configured to output a variable compensation signal having a fixed component based upon the deviation between the initial and desired gains, and a variable component based upon an out-of-loop influence on the gain of the power amplifier.

37. A method of controlling gain in a power amplifier, comprising:
(a) generating a compensation signal outside of a closed loop gain control circuit in the power amplifier that compensates for at least one influence on the gain of the power amplifier that is not accommodated for by the closed loop gain control circuit; and
(b) using the compensation signal to control the gain of the power amplifier with the closed loop gain control circuit;
wherein generating the compensation signal includes processing a temperature-dependent signal generated by a temperature sensor using a compensation equation.

38. The method of claim 37, wherein the influence comprises a deviation between an initial gain for the power amplifier, and a desired gain for the power amplifier, and wherein generating the compensation signal includes generating a variable compensation signal, wherein the variable compensation signal has a fixed component based upon the deviation between the initial and desired gains, and a variable component based upon an out-of-loop influence on the gain of the power amplifier.

* * * * *